(12) United States Patent
Sachdev et al.

(10) Patent No.: US 7,714,628 B2
(45) Date of Patent: May 11, 2010

(54) SOFT ERROR ROBUST FLIP-FLOPS

(75) Inventors: Manoj Sachdev, Waterloo (CA); Shah M. Jahinuzzaman, Waterloo (CA)

(73) Assignee: Certichip Inc., Waterloo, Ontario (CA)

( * ) Notice: Subject to any disclaimer, the term of this patent is extended or adjusted under 35 U.S.C. 154(b) by 144 days.

(21) Appl. No.: 12/059,238

(22) Filed: Mar. 31, 2008

(65) Prior Publication Data

US 2008/0180153 A1 Jul. 31, 2008

Related U.S. Application Data

(63) Continuation-in-part of application No. 11/876,223, filed on Oct. 22, 2007, now Pat. No. 7,613,067.

(60) Provisional application No. 60/853,034, filed on Oct. 20, 2006.

(51) Int. Cl.
*H03K 3/356* (2006.01)
(52) U.S. Cl. .................. 327/208; 327/210; 327/211; 327/218; 327/219
(58) Field of Classification Search ......... 327/199–203, 327/208, 210, 211, 214, 215, 218, 219
See application file for complete search history.

(56) References Cited

U.S. PATENT DOCUMENTS

| | | | |
|---|---|---|---|
| 7,323,920 B2 * | 1/2008 | Naffziger | 327/210 |
| 2006/0119406 A1 * | 6/2006 | Henzler et al. | 327/208 |
| 2007/0268054 A1 * | 11/2007 | Uemura et al. | 327/202 |
| 2009/0085627 A1 * | 4/2009 | Gill et al. | 327/214 |

OTHER PUBLICATIONS

Partovi, et al., Flow-Through Latch and Edge-Triggered Flip-flop Hybrid Elements, IEEE Journal of Solid-State Circuits, Feb. 1996, pp. 138-139, ISSCC96/Paper FA 8.5.

(Continued)

*Primary Examiner*—Long Nguyen

(57) ABSTRACT

A flip-flop circuit is provided with an improved robustness to radiation induced soft errors. The flip-flop cell comprises the following elements. A transfer unit for receiving at least one data signal and at least one clock signal, a storage unit coupled to the transfer unit and a buffer unit coupled to the storage unit. The transfer unit includes a plurality of input nodes adapted to receive said at least one data signal and said at least one clock signal; a first output node for providing a sampled data signal in response to said at least one clock signal and said at least one data signal; and a second output node for providing a sampled inverse data signal, the sampled inverse data signal provided in response to said at least one clock signal and said at least one data signal. The storage unit comprises a first and a second storage nodes configured to receive and store the sampled data signal and the sampled inverse data signal. The storage unit comprises drive transistors configured to selectively couple one of the first and second storage nodes to ground; load transistors configured to selectively couple the other one of the first and second storage nodes to a power supply; and at least one stabilizer transistor configured to provide a corresponding redundant storage node and limit feedback between the first and second storage nodes, the redundant storage node being capable of restoring the first or second storage nodes in case of a soft error. The buffer unit provides an output sampled data signal as received from the storage unit.

14 Claims, 11 Drawing Sheets

OTHER PUBLICATIONS

Suzuki, et al., Clocked CMOS Calculator Circuitry, IEEE Journal of Solid-State Circuits, Dec. 1973, pp. 462-469, vol. Sc-8, No. 6.

Yuan, et al., High-Speed CMOS Circuit Technique, IEEE Journal of Solid-State Circuits, Feb. 1989, pp. 62-70, vol. 24, No. 1.

* cited by examiner

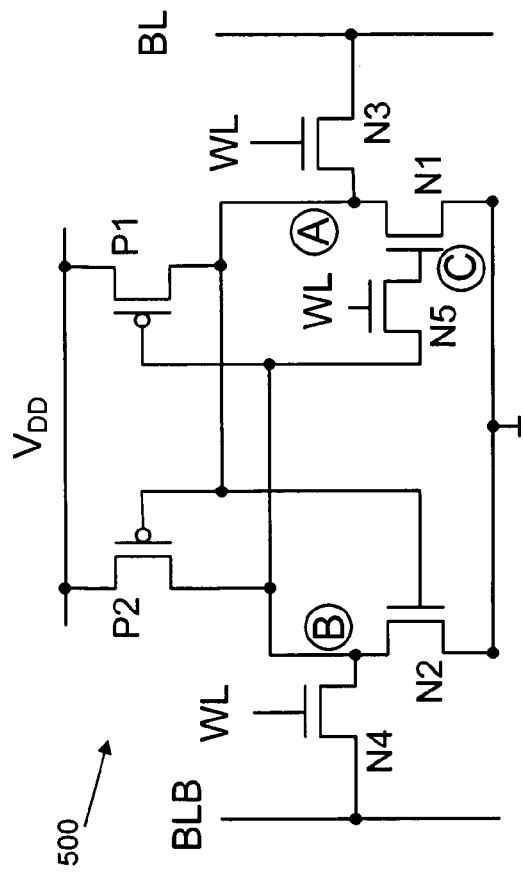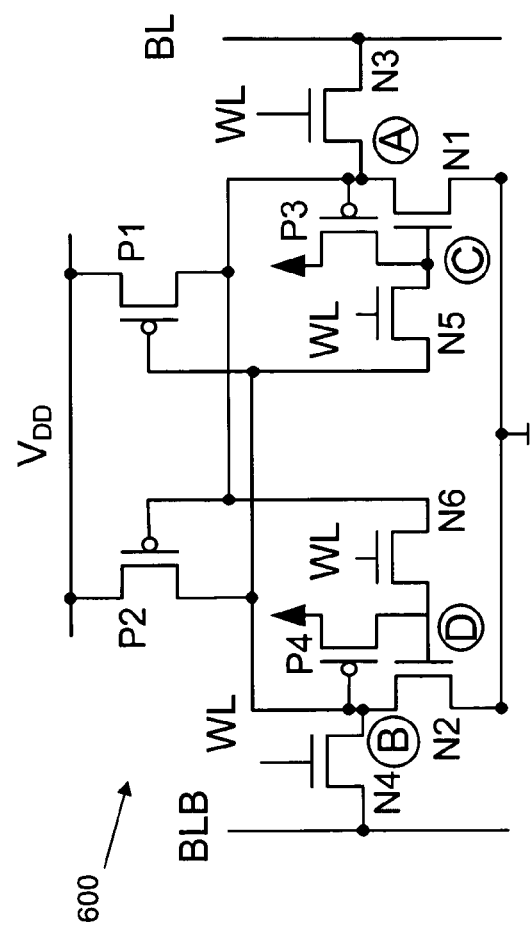

SOFT ERROR ROBUST FLIP-FLOPS

FIELD OF THE INVENTION

The present invention relates generally to memory cells such as Static Random Access Memory (SRAM) cells and flip-flops that limit the effect of radiation induced soft errors. The present application is a continuation in part of a U.S. patent application Ser. No. 11/876,223 filed on Oct. 22, 2007 now U.S. Pat. No. 7,613,067, which is incorporated herein by reference in its entirety and claims priority from U.S. Provisional Application No. 60/853,034 filed on Oct. 20, 2006.

BACKGROUND OF THE INVENTION

Flip-flops are widely used in integrated circuits, such as in microprocessors and other digital circuits to temporarily store data. A flip-flop stores data by sampling an input data signal with a clock signal at a particular instant of time, typically at an edge of the clock. The output of the flip-flop is sensitive to the input data signal at the clock edge. At all other times, the output does not respond to changes in the input data signal.

A flip-flop can be realized in a variety of ways as understood by a person skilled in the art. A typical way of realizing a flip-flop is to use two series connected latches called a master and a slave as illustrated in FIG. 8. In the illustrated example, the master latch is transparent to a low (0) clock signal level while the slave is transparent to a high (1) clock signal, making the output of the flip-flop sensitive only to 0 to 1 transition of the clock. However, such master-slave flip-flops present several shortcomings. For example, in order to change the output of the master-slave flip-flop, a signal propagates through both the master and the slave stages. The resulting delay poses limitations in high speed circuits. Further, the data values in the master and the slave stages can be susceptible to ionizing radiation. Types of ionizing radiation may include alpha particles and cosmic neutrons. These particles can generate a large number of electron hole pairs, which may be collected by the storage nodes and result in a data upset, which is known as a soft error (SE). This is particularly true for nanoscaled circuits where the charge representing a data state on a storage node is very small due to low node capacitance and supply voltage.

The SE problem is addressed by using SE immune latches, such as the Dual Interlocked Cell (DICE) latch, for the master and slave stages. For example, referring to FIG. 9, a schematic diagram of an SE immune flip-flop having master slave stages is illustrated. However, this type of flip-flop has a large number of transistors, which can cause significant delay, an increase in area, and power penalties. In addition, the flip-flop increases the clock load and hence the clock power consumption. As a consequence, this type of flip-flop is not suitable for high speed or low power applications.

Due to the growing need for technology scaling and the corresponding susceptibility to radiation induced soft error, it would be advantageous to provide soft error robust flip flops. Further, it is desirable to improve the flip flop circuit immunity against soft error while limiting the number of extra transistors. Reducing the number of transistors allows the flip-flops to occupy less space and permits higher cell density. As well, fewer transistors reduce delay, and allow for more efficient power usage such that the flip flops may be suitable for high speed or low power applications.

SUMMARY OF THE INVENTION

In accordance with an aspect of the present invention there is provided a flip-flop comprising a transfer unit for receiving at least one data signal and at least one clock signal, a storage unit coupled to the transfer unit and a buffer unit coupled to the storage unit; the transfer unit comprising: a plurality of input nodes adapted to receive said at least one data signal and said at least one clock signal; a first output node for providing a sampled data signal in response to said at least one clock signal and said at least one data signal; and a second output node for providing a sampled inverse data signal complementary to the sampled data signal, the sampled inverse data signal provided in response to said at least one clock signal and said at least one data signal; the storage unit comprising a first and a second storage nodes configured to receive and store the sampled data signal and the sampled inverse data signal, the storage unit comprising: drive transistors configured to selectively couple one of the first and second storage nodes to ground; load transistors configured to selectively couple the other one of the first and second storage nodes to a power supply; and at least one stabilizer transistor configured to provide a corresponding redundant storage node and limit feedback between the first and second storage nodes, the redundant storage node being capable of restoring the first or second storage nodes in case of a soft error; the buffer unit for receiving input from at least one of the storage nodes and the redundant storage node and for providing an output sampled data signal.

BRIEF DESCRIPTION OF THE DRAWINGS

Embodiments of the present invention will now be described by way of example only with reference to the following drawings in which:

FIG. 5 is a schematic drawing of a SER SRAM cell in accordance with an alternate embodiment;

FIG. 6 is a schematic drawing of a SER SRAM cell in accordance with yet an alternate embodiment;

DETAILED DESCRIPTION OF THE PREFERRED EMBODIMENTS

Figure 1:
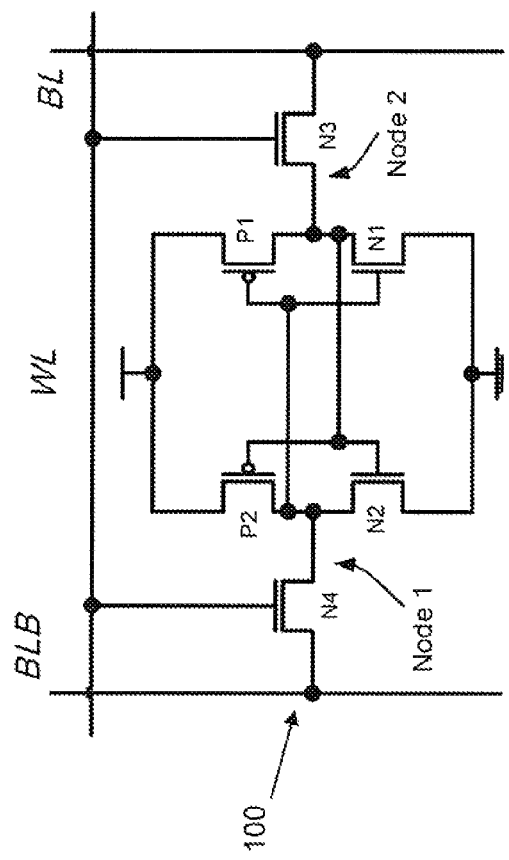
FIG. 1 is a schematic drawing of a standard SRAM cell (prior art)
Figure 2:
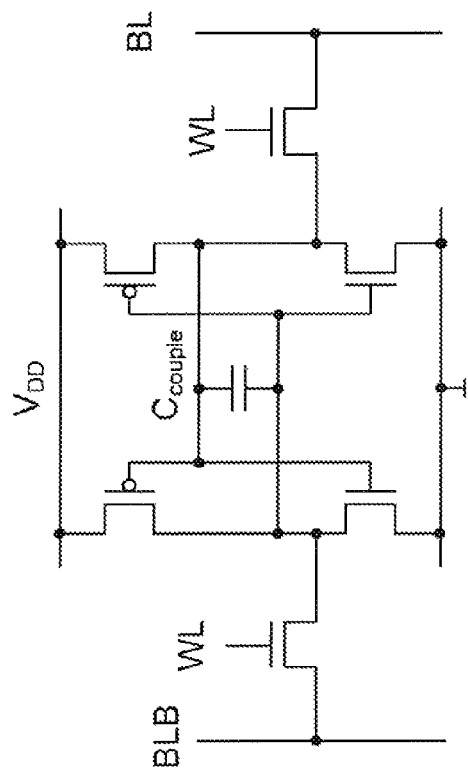
FIG. 2 is a schematic drawing of a proposed SRAM having improved robustness to radiation induced soft errors (prior art)
Figure 3:
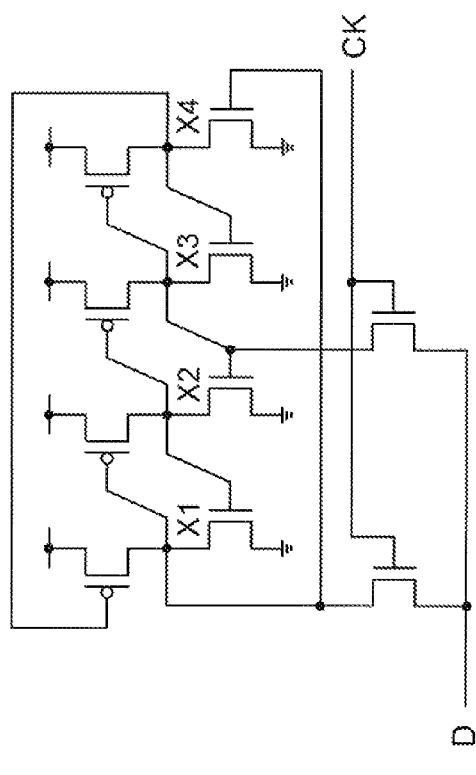
FIG. 3 is a schematic drawing of an alternate proposed SRAM having improved robustness to radiation induced soft errors (prior art)

For convenience, like numerals in the description refer to like structures in the drawings. Referring to FIG. 1, a standard six-transistor SRAM cell is illustrated generally by numeral 100. The SRAM cell 100 comprises a pair of n-type drive transistors N1 and N2 and a pair of p-type load transistors P1 and P2 in a cross-coupled configuration. A further pair of n-type access transistors N3 and N4 couples the cell 100 to a complementary bit-line pair BL and BLB. The sources of the drive transistors N1 and N2 are coupled to ground, and the sources of the load transistors P1 and P2 are coupled to a supply voltage VDD.

The SRAM cell 100 is coupled to the bit-line pair BL and BLB in a response to a word-line control signal WL from a row decoder (not shown). Accordingly, when the word-line control signal WL is active, the SRAM cell 100 is electrically connected to the bit-line pair BL and BL.

Figure 4:
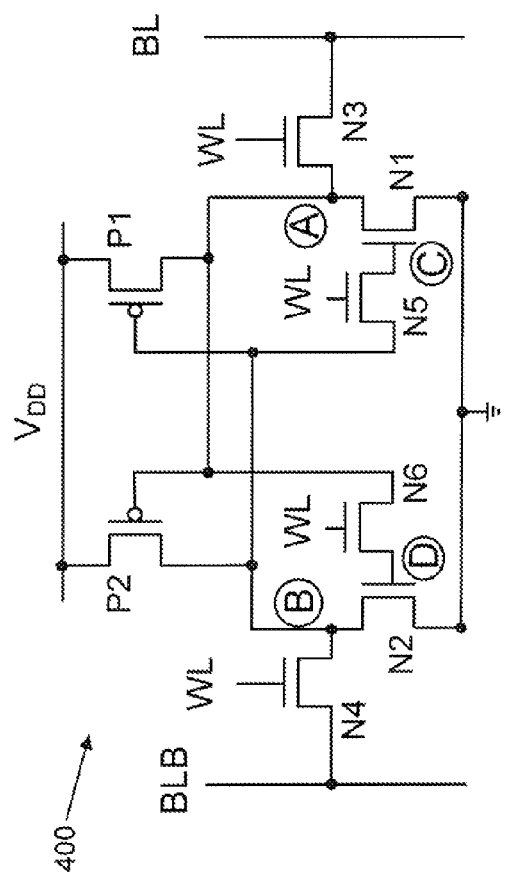
FIG. 4 is a schematic drawing of a soft error robust (SER) SRAM cell in accordance with one embodiment.

Referring to FIG. 4, a soft error robust (SER) SRAM cell in accordance with an embodiment of the invention is illustrated generally by numeral 400. The SER SRAM cell 400 is similar to SRAM cell illustrated in FIG. 1. For ease of description, the node at the junction of the drain of load transistor P1 and the source of drive transistor N1 will be referred to as storage node A. Similarly, the node at the junction of the drain of load transistor P2 and the source of drive transistor N2 will be referred to as storage node B. The nodes A and B are referred to as storage node because they store respective voltages when the access transistors N3 and N4 are turned off, as is known in the art.

However, in the present embodiment, the drive transistors N1 and N2 are designed to be stronger than their corresponding load transistors P1 and P2, respectively. Further, the cell comprises an additional two n-type stabilizer transistors N5 and N6. Stabilizer transistor N5 is coupled between the gate of load transistor P1 and the gate of drive transistor N1. Stabilizer transistor N6 is coupled between the gate of load transistor P2 and the gate of drive transistor N2. The gates of the stabilizer transistors N5 and N6 are connected to the word line WL. For ease of description, the node at the gate of stabilizer transistor N5 will be referred to as storage node C and the node at the gate of stabilizer transistor N6 will be referred to as storage node D. Storage nodes C and D are provide redundant storage.

The SER SRAM cell 400 is able to hold two states when the access transistors N3 and N4 are turned off. The states are associated with a binary one and a binary zero. Accordingly, when the access transistors N3 and N4 are turned off storage nodes A and B store voltages for a corresponding binary number.

From the description above as well as from FIG. 4, it will be appreciated that the stabilizer transistors N5 and N6 break the inherent positive feedback between the storages nodes A and B and provide additional storage nodes C and D. That is, the gates of the stabilizer transistors N5 and N6 are controlled by the word line WL so that the feedback mechanism only works when the word line WL goes high. Further, the stabilizer transistors N5 and N6 are designed to have a very low threshold voltage, and hence a higher leakage. This feature helps achieve almost full swing at the storage nodes C and D. Alternatively, the word line WL may be overdriven to achieve full swing signal at the storage nodes C and D.

It will be appreciated that breaking the inherent feedback of the cross-coupled drive and load transistors N1, N2, P1, and P2, respectively, and providing additional storages nodes improves the robustness of an SRAM cell significantly.

For example, consider the case when storage nodes A and D store a logic 1 while storage nodes B and C store a logic 0. If the voltage at storage node A becomes logic 0 due to a soft error, such as cosmic radiation, the load transistor P2 turns on. However, drive transistor N2 is also on because storage node D stores a logic 1.

Since drive transistor N2 is designed to be stronger than load transistor P2, storage node B will retain its original logic value of 0. This will, in turn, keep load transistor P1 turned on. Since load transistor P1 remains on, it will ensure the storage node A recovers its original logic value of 1. Similarly, a radiation incident on storage node B will not also result in a data upset.

Referring to FIG. 5, a SER SRAM cell in accordance with an alternate embodiment is illustrated generally by numeral 500. The SER SRAM cell 500 of the present embodiment is similar to the SER SRAM 400 as described with reference to FIG. 4. However, in the present embodiment, the SER SRAM cell 500 includes only one stabilizer transistor N5.

Referring to FIG. 6, a SER SRAM cell in accordance with yet an alternate embodiment is illustrated generally by numeral 600. The SER SRAM cell 600 of the present embodiment is similar to the SER SRAM 400 as described with reference to FIG. 4. However, in the present embodiment, the SER SRAM cell 600 includes supply transistors P3 and P4. As shown, the supply transistor P3 is coupled between the power supply VDD and storage node C, and is gated by the voltage stored on storage node A. Similarly, the supply transistor P4 is coupled between the power supply VDD and storage node D, and is gated by the voltage stored on storage node B.

Although the SER SRAM cell 600 operates in a similar manner to the SER SRAM cell 400 described with reference to FIG. 4, the two supply transistors P3 and P4 are added to provide more stable complementary voltages at storage nodes C and D, respectively.

Figure 7:
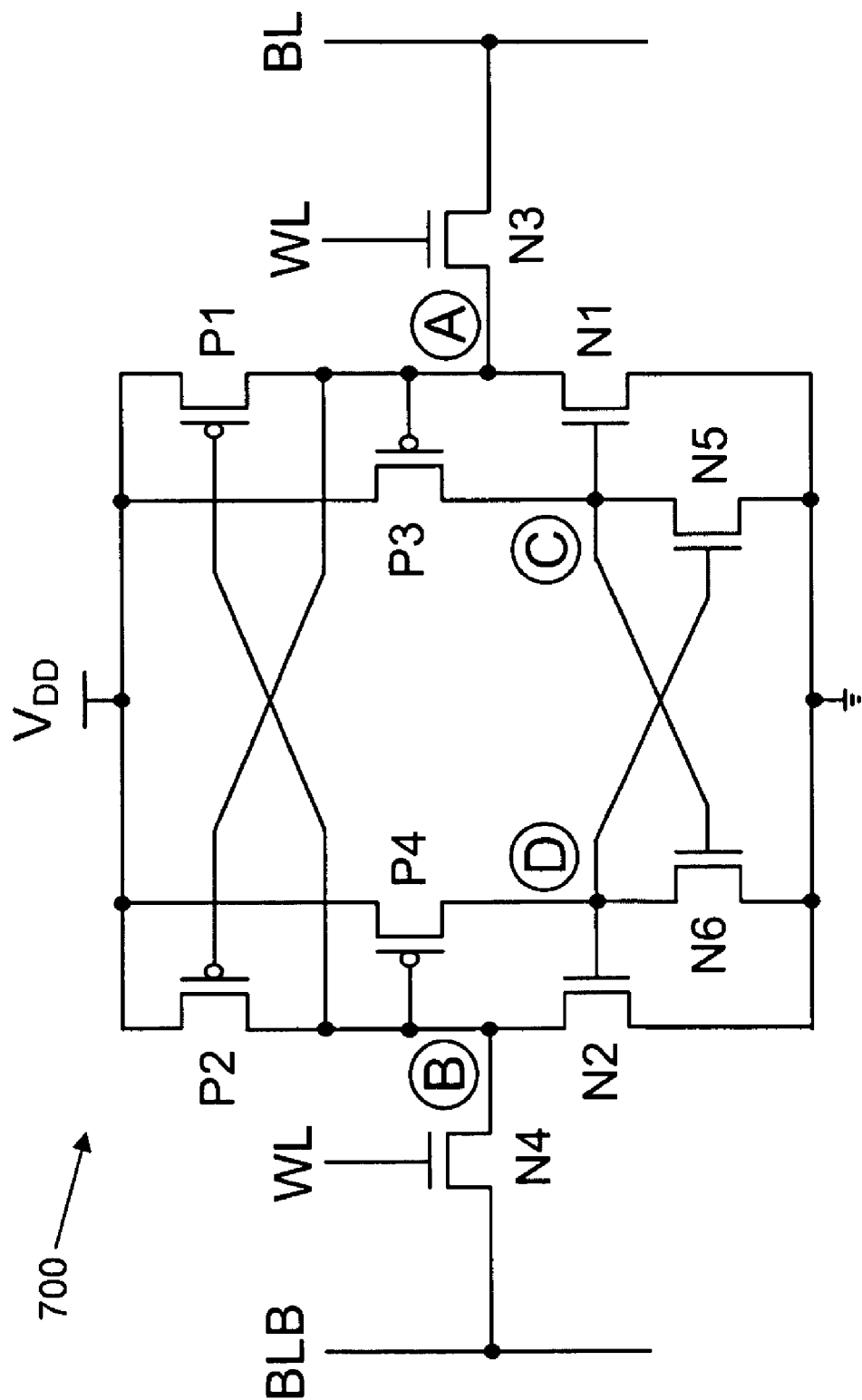
FIG. 7 is a schematic drawing of a SER SRAM cell in accordance with yet an alternate embodiment.
Figure 8:
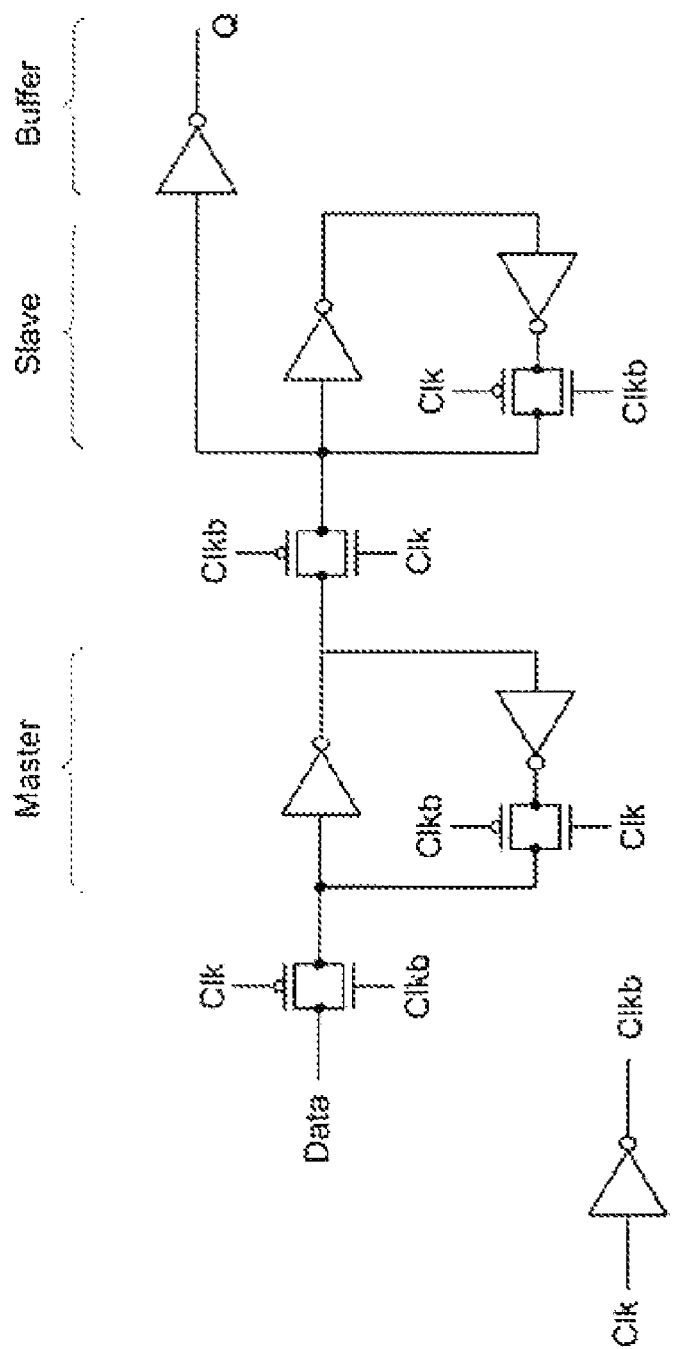
FIG. 8 is a schematic diagram of a master-slave flip-flop (prior art)
Figure 9:
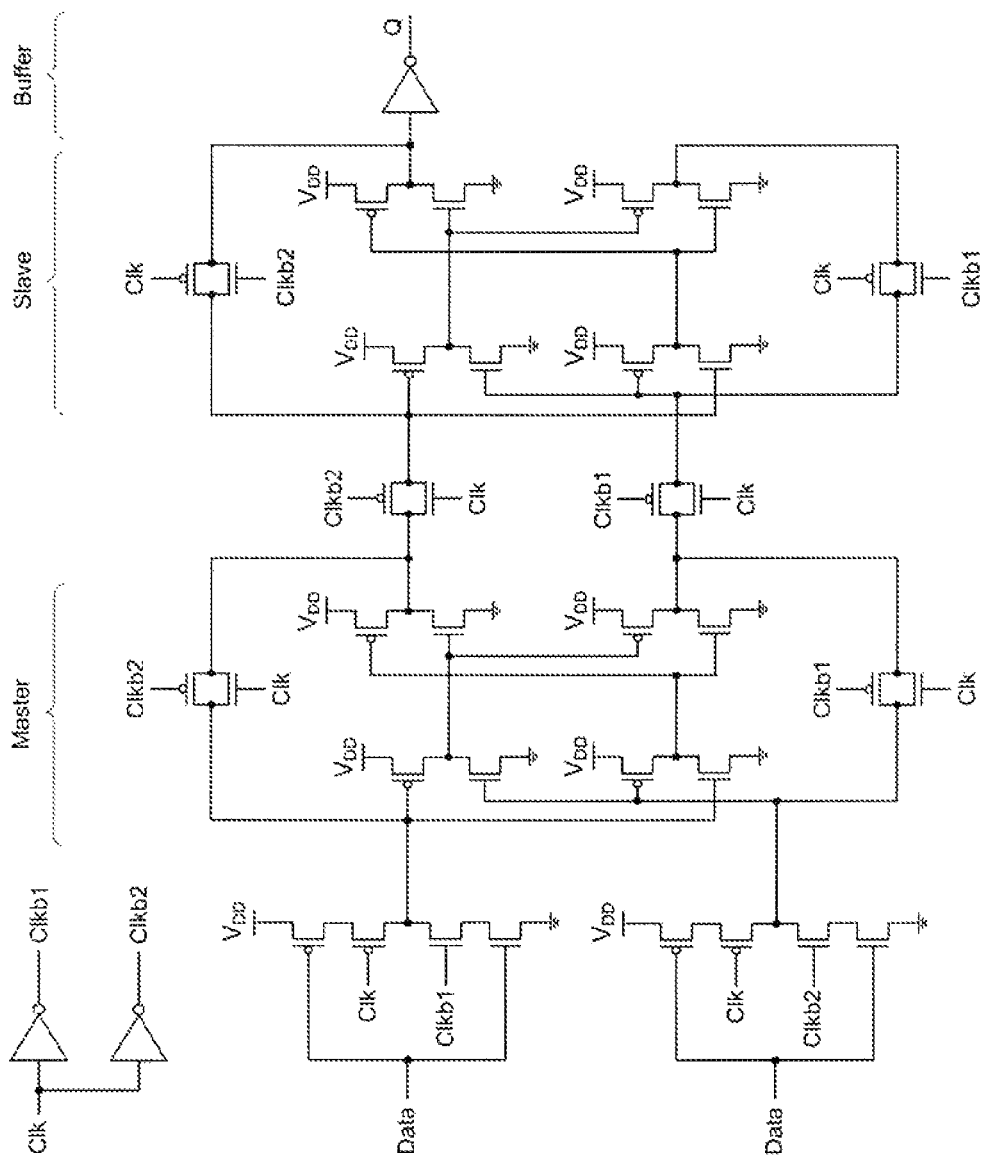
FIG. 9 is a schematic diagram of an SE robust master-slave flip-flop (prior art)

Referring to FIG. 7, a SER SRAM cell in accordance with yet an alternate embodiment is illustrated generally by numeral 700. Load transistors P1 and P2 are coupled at the source to the power supply VDD. The drain of load transistor P1 is coupled to storage node A. The drain of load transistor P2 is coupled to storage node B. Load transistor P2 is gated by storage node A and load transistor P1 is gated by storage node B.

The drain of drive transistor N2 is coupled to storage node B. The drain of drive transistor N1 is coupled to storage node A. Both drive transistors N1 and N2 are coupled at the source to ground. Drive transistor N1 is driven by storage node C and drive transistor N2 is driven by storage node D.

Stabilizer transistor P4 is coupled between the power supply and storage node D, and is driven by storage node B. Stabilizer transistor N6 is coupled between storage node D and ground, and is driven by storage node C.

Stabilizer transistor P3 is coupled between the power supply and storage node C, and is driven by storage node A. Stabilizer transistor N5 is coupled between storage node C and ground, and is driven by storage node D.

Storage nodes A and B are coupled to bit-line pair BL and BLB by access transistors N3 and N4, respectively.

Similar to the previously described embodiments, the gates of the drive transistors N1 and N2 are driven by the storage nodes C and D. However, in the present embodiment, the complementary logic voltages at the internal nodes are held very strongly either at logic 1 or logic 0 by cross-coupled stabilizer transistors P3, P4, N5 and N6. Accordingly, the load transistors P1 and P2 and the drive transistors N1 and N2 are effectively cross coupled via the cross-coupled stabilizer transistors P3, P4, N5 and N6.

Such an arrangement provides two strong redundant storage nodes C and D. Consequently, in the event of a particle strike at one of the nodes A, B, C or D, there are three unaffected nodes that can restore the logic state of the affected node. Thus, the SER SRAM cell greatly reduces the likelihood of a SRAM cell experiencing a soft error.

In accordance with another embodiment, the SER cells described above in reference to FIGS. 4-7 are used as storage units for providing SER flip-flop circuits. Preferably, the circuit illustrated in FIG. 7 is utilized as a storage unit for the flip-flop circuits described below.

Figure 10:
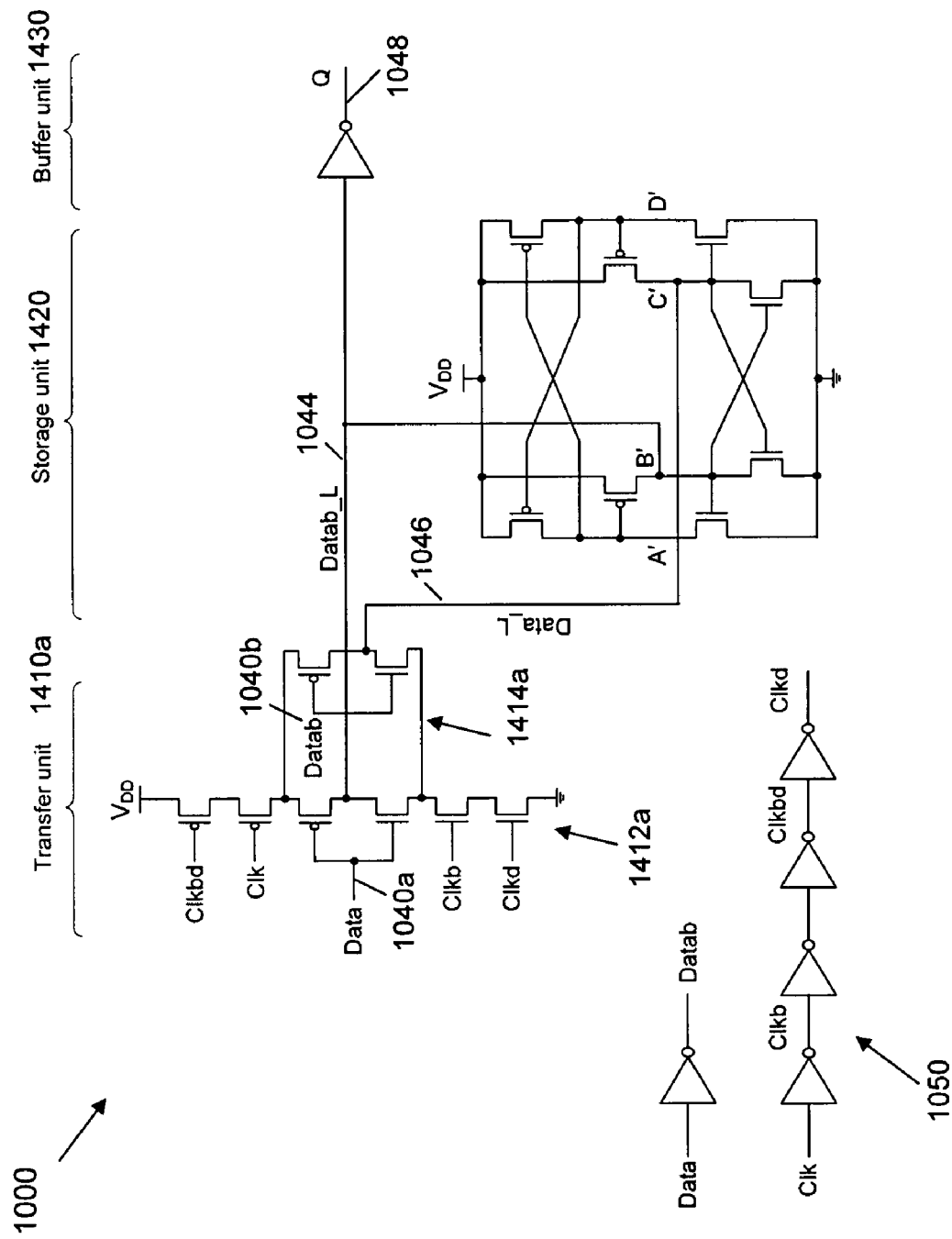
FIG. 10 is a schematic diagram of an SER flip-flop in accordance with one embodiment.
Figure 11:
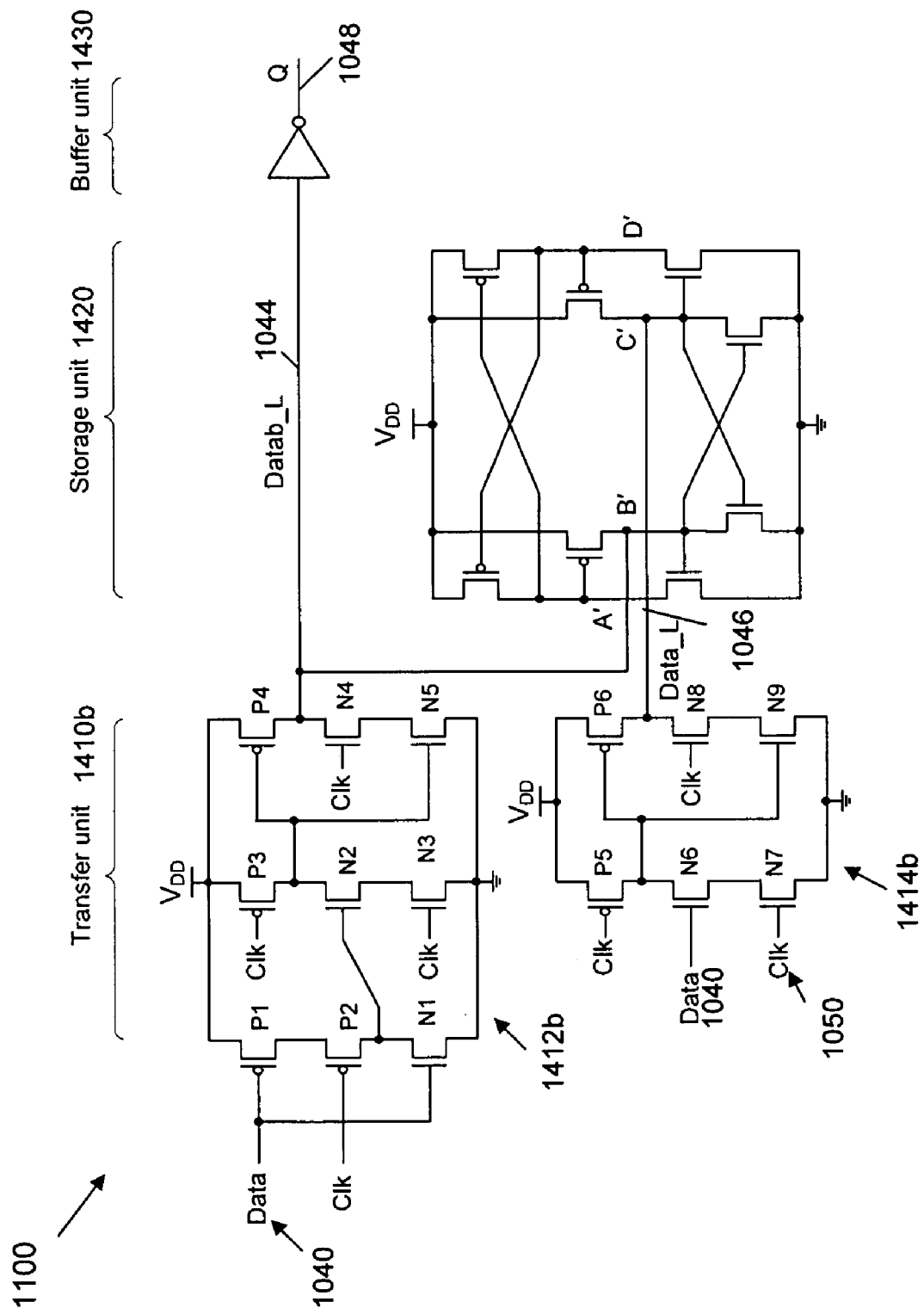
FIG. 11 is a schematic diagram of an SER flip-flop in accordance with an alternate embodiment.
Figure 12:
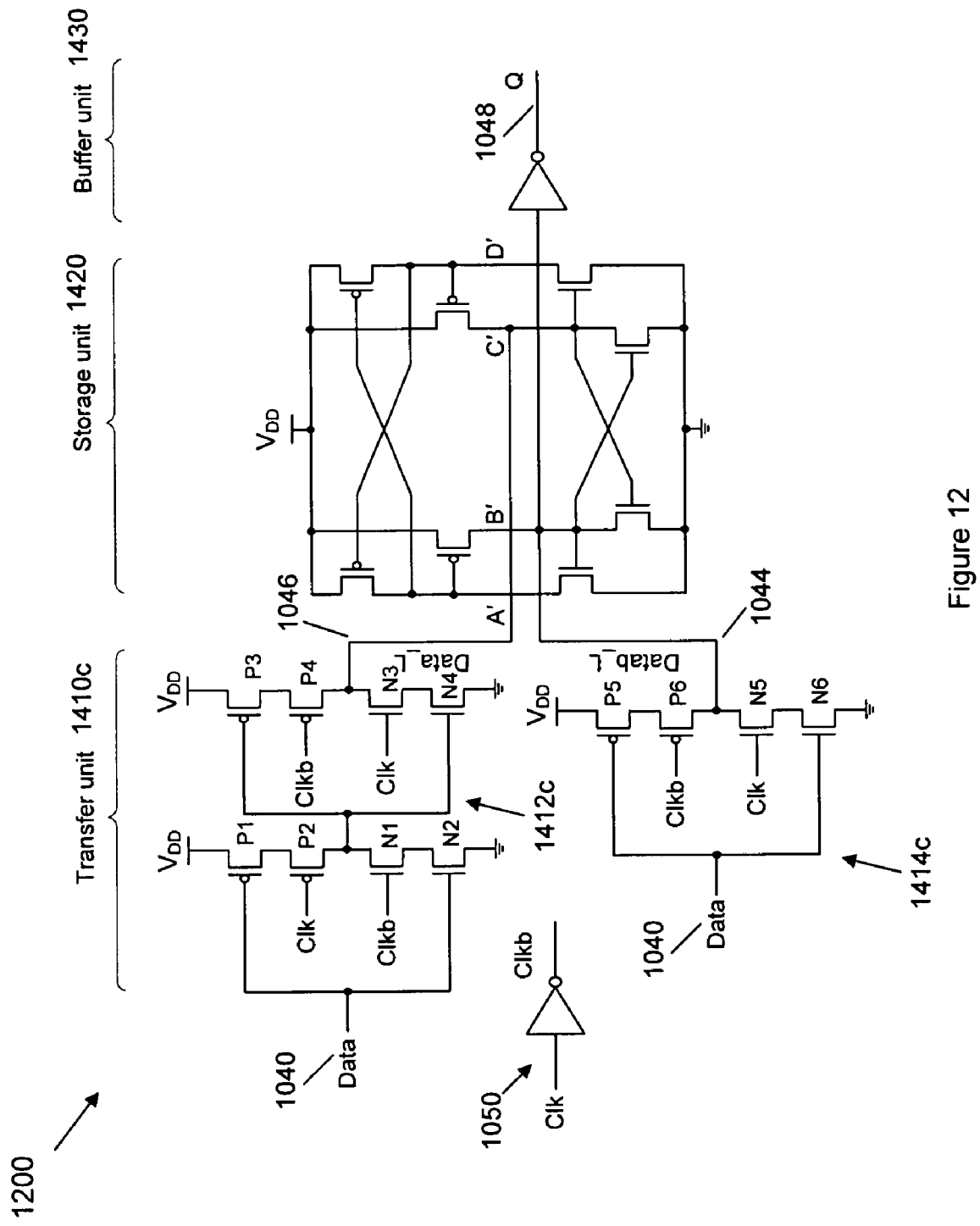
FIG. 12 is a schematic diagram of an SER flip-flop in accordance with yet another alternate embodiment.
Figure 14:
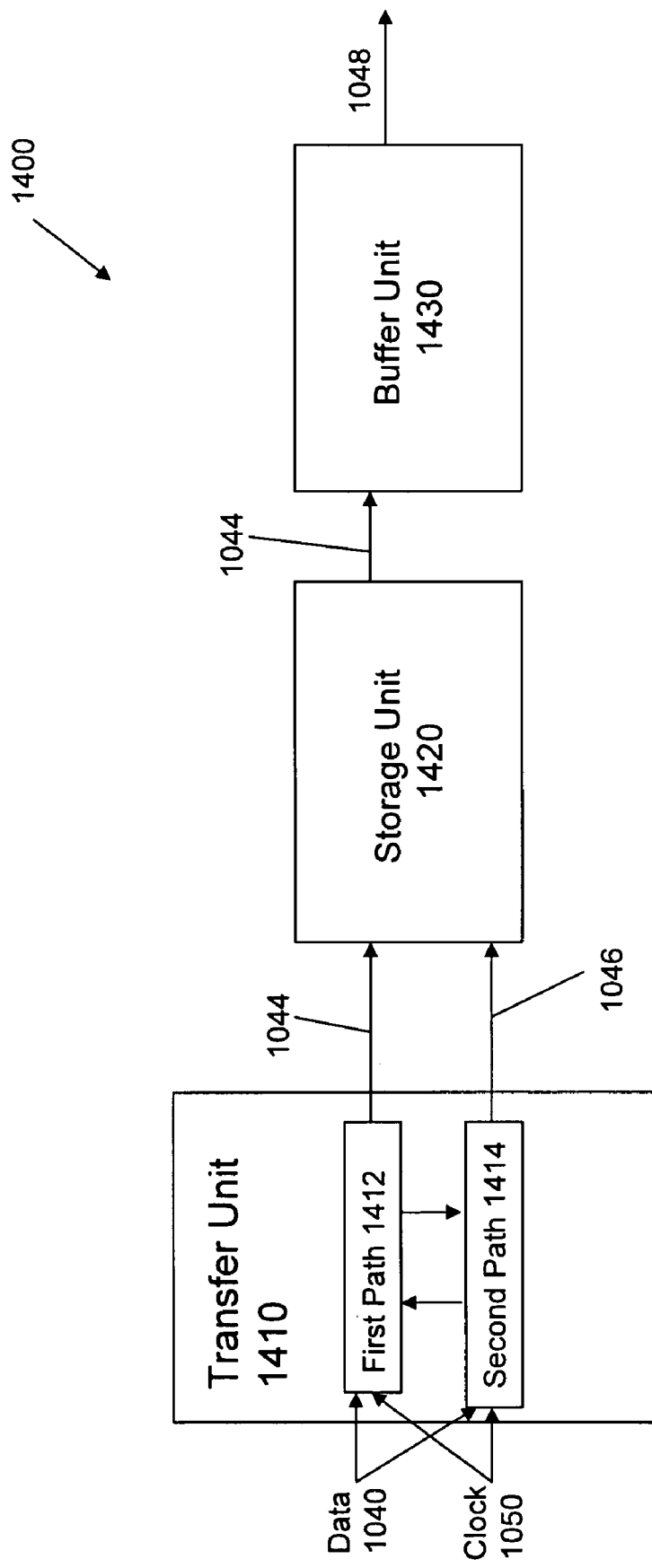
FIG. 14 is an overview block diagram of SER flip flops according to any one of FIGS. 10-12.

Referring generally to FIG. 14, shown is a block diagram of soft error robust (SER) flip-flop in accordance with an embodiment of the invention illustrated generally by numeral 1400. As will be discussed, FIGS. 10-12 illustrate implementations of the SER flip-flop illustrated in FIG. 14.

As illustrated in FIG. 14, the SER flip-flop 1400 comprises a transfer unit 1410, a storage unit 1420, and a buffer unit 1430. Each transfer unit 1410 comprises one or more input nodes for receiving at least one data signal 1040 and at least one clock signal 1050. The transfer unit 1410 is activated by the one or more clock signals 1050 to conditionally transfer a sample of the input data 1046 and a sample of the inverse of the data 1044 as output to two of the storage nodes of the storage unit 1420. As will be understood, the sampled data signal 1046 and the sampled inverse data signal 1044 are complementary to one another. As will be described below, the storage unit 1420 preferably includes two storage nodes for receiving input from the transfer unit 1410 and two redundant storage nodes for storing a copy of each of the samples 1046 and 1044 received.

As illustrated in FIG. 14, each transfer unit 1410 has two separate data paths from the input data 1040 to the sampled data 1044 and 1046 provided to the storage unit 1420. The two data paths comprise a first data path 1412 for providing the sampled data inverse 1044 and the sampled data 1046 in response to receiving the one or more data signals 1040 and the one or more clock signals 1050. As will be described, the two separate data paths, allow the transfer unit 1410 to be relatively robust against soft errors. That is, if either one of the first and second data paths 1412 or 1414 is affected by a soft error, the transfer unit 1410 remains unaffected. This is because the sampled data 1046 (also shown as Data_L) and the sampled data inverse 1044 (also shown as Datab_L) need to be the complement or inverse of one another in order to be stored on the storage unit 1420. Thus, the previous value stored on the storage unit 1420 remains until both the sampled data 1046 and the sampled data inverse 1044 are both provided as complementary values to the storage unit 1420. It will be appreciated that the clock controlled transfer unit 1410 is thus SE robust as it masks any propagation of particle induced transients to the storage unit 1420.

Once the sampled data 1046 and the sampled data inverse 1044 are received by the storage unit 1420, these samples are preserved in the storage unit 1420 on a plurality of nodes (e.g. nodes A'-D' as described below) such that there is a redundant node for each sample. Thus, in the event of particle strike at a node, there are three unaffected nodes that can restore the logic voltage of the affected node. Consequently, the storage unit 1420 does not experience a SE. Finally, the buffer unit 1430 is driven by a node of the SE immune storage unit 1420, and thus keeps the output of the flip-flop 1048 immune to SE.

Referring to FIG. 10, a schematic of a soft-error robust flip-flop (SER-FF) in accordance with an embodiment of the flip-flop 1400 is illustrated generally by the numeral 1000. The transfer unit 1410a comprises a stack of NMOS and PMOS transistors for receiving the one or more data signals (a data signal 1040a and an inverse data signal 1040b) and the plurality of clock signals 1050. As described earlier, the transfer unit 1410a then provides the sampled data signal 1046 and its inverse 1044 to the storage unit 1420 in response to the clock signals 1050.

Referring to FIG. 10, the input data 1040a is processed by a first data path 1412a and the input data complement signal 1040b is processed by a second data path 1414a. The transfer unit 1410a provides an additional data path (the second data path 1414a) for receiving the complementary data signal Datab 1040b as input. The additional datapath is provided in parallel to the first data path having data 1040a as its input. Preferably, according to the present embodiment, the transistors of the first data path 1412a are placed at a predetermined distance from the transistors of the second data path 1414a on the flip-flop 1000. In this way, only one of the first and second data paths 1412a, 1414a is sensitive to soft errors and the overall transfer unit 1410a remains SER.

In the present embodiment, the plurality of clock signals 1050 comprises a plurality of phase shifted clock signals. Specifically, the plurality of clock signals 1050 comprises a first clock (Clk) signal, and three other clock signals Clkb, Clkbd, and Clkd, which are generated from the first clock Clk signal using an inverter chain illustrated in FIG. 10. At the falling edge of the first clock signal (e.g. when Clk goes from 1 to 0), Clk, Clkb, Clkbd, and Clkd generate a pulse of narrow time window during which a sample of the input data 1040a and its inverse 1040b (Datab) passes to the storage unit 1420 as sampled inverse data Datab_L 1044 and sampled data Data_L 1046, respectively. Accordingly, it is only during this narrow time window where both the sampled input data 1046 and the sampled inverse data 1044 are transferred to the storage unit 1420. At all other times, the output of the transfer unit 1410a is tri-stated and thus remains robust against soft error (SE).

Accordingly, the transfer unit 1410a is operational through a small timing window (provided by the plurality of clock signals 1050) that samples the input data 1040a as well as its complement 1040b. As described, this timing window is implemented by combining different phases of a clock signal. The FF 1000 updates its output 1048 according to the input data (e.g. 1040a and 1040b) on the falling edge of the clock Clk signal, and thus is a negative edge triggered FF 1000. Thus, the storage unit 1420 can indefinitely retain the data in its storage nodes (e.g. nodes A'-D') if the flip-flop 1000 is powered and there is no activity on the clock input (e.g. 1050).

The storage unit 1420 illustrated in FIGS. 10-12 comprises eight NMOS and PMOS transistors and four storage nodes: A', B', C', and D'. The transistors in the storage unit 1420 are connected in such a way that stable logical values at nodes A', B', C', D' can only be either (0, 1, 0, 1) or (1, 0, 1, 0), respectively. Thus, for every node, there is a redundant node (e.g. C' is the redundant node to A' and B' is the redundant node to D'). In the event of particle strike at a node, the redundant node coupled with two other unaffected nodes restores the logic state of the affected node. Thus, the storage unit 1420 and hence the logic states at the sampled data inverse 1044 Datab_L and the sampled data 1046 Data_L never experience an SE. Finally, referring to FIGS. 10-12, since the buffer unit 1430 is a simple inverter, which is driven by the value of the input sampled data inverse 1044 Datab_L signal to drive the output, the output 1048 also becomes SE immune.

Referring to FIG. 11, a circuit schematic of an SER-FF in accordance with an alternate embodiment of the flip-flop 1400 is illustrated generally by numeral 1100. The SER flip flop 1100 is similar to the SER flip flop 1000. However, in the present embodiment, the transfer unit 1410b is provided by a multiple stage, single phase clock controlled inverters placed in two parallel paths. The transfer unit 1410*a* provides two separate data paths (1412*b* and 1414*b*) for resulting in SER flip-flops. In the illustrated embodiment, the transfer unit 1410*b* comprises the first path 1412*b* and the second parallel path 1414*b* adapted to generate a sample of the input data signal Data_L 1046 and a sample of the inverted data signal 1044 Datab_L.

As illustrated in FIG. 11, the first and second paths (1412*b* and 1414*b*) are inverters controlled by a single phase clock Clk signal 1050. The first path 1412*b* generates the sampled inverted data signal Datab_L 1044 using three clock-controlled stages with the same single phase clock signal 1050. The first path 1412*b* receives the input data signal 1040 and the clock signal 1050 at its input and is coupled at the output to one of the nodes of the storage unit 1420 (e.g. node B'). The second path 1414*b* receives the input data signal 1040 and the clock signal 1050 at its input and is coupled at the output to another node of the storage unit (e.g. C').

The first stage of the first path 1412*b* comprises two PMOS transistors (P1, P2) and one NMOS transistor (N1). While each of second and third stages comprises two NMOS transistors (N2, N3; N4, N5) and one PMOS transistor (P3; P4). The first stage is coupled between VDD and ground.

As described earlier, the second path 1414*b* also comprises two stage single phase clock controlled inverters to generate the sampled data signal 1046 Data_L. The second path 1414*b* is also driven by the same single phase clock signal 1050 and the data signal 1040. The second path 1414*b* is coupled between VDD and ground.

The organization of the transistors and their control by the clock signal Clk 1050 and the data signal 1050 provides the transfer unit 1410*b* with robustness against SE. That is, the redundancy provided by the two parallel data paths 1412*b* and 1414*b* driven by the same clock signal 1050 which independently provide an output data sample 1046 and its complementary data sample 1044 improve the reliability of the transfer unit 1410*b*.

The storage unit 1420 and the buffer unit 1430 of the flip-flop 1100 are the same as those in the SER-FF 1000 and are SE robust for the reasons described above. It will be appreciated that the difference between the transfer unit 1410*b* and transfer unit 1410*a* is that the transfer unit 1410*b* (and thus the SER FF 1100) samples the input data at the rising edge of the clock signal Clk 1050.

Referring to FIG. 12, there is illustrated a circuit schematic of an SER-FF in accordance with yet another alternate embodiment of the flip-flop 1400 and shown generally by numeral 1200. Unlike the SER-FF 1100, the SER-FF 1200 configuration uses a two phase clock (Clk and Clkb) and the clocked CMOS logic to generate each of the sampled data signal Data_L 1046 and the sampled inverse data signal Datab_L 1044 through two parallel paths 1412*c* and 1414*c*. The transfer unit 1410*c* includes two parallel data paths (1412*c* and 1414*c*) for providing an SE robust flip-flop. The first path 1412*c* generates the sampled data Data_L 1046 signal using two clocked CMOS inverter stages, each of which consists of two PMOS transistors (P1, P2; P3, P4) and two NMOS transistors (N1, N2; N3, N4). The second path 1414*c* generates the sampled data inverse Datab_L 1044 signal using one of such inverter stages.

As illustrated in FIG. 12, the first path 1412*c* has its input coupled to the data signal 1040 and complementary clock signals 1050 (Clk and Clkb). The output of the first path 1412*c* is coupled to one of the nodes of the storage unit (e.g. node C'). Further, the second path 1414*c* has its input coupled to the data signal 1040, complementary clock signals 1050 (Clk and Clkb). The output of the second path is coupled to another one of the nodes of the storage unit (e.g. node B').

Since each of the nodes in the transfer unit 1410*c* is controlled by the clock signals Clk or Clkb and the input data signal 1040, the transfer unit 1410*c* exhibits robustness against SE. As described earlier in reference to FIGS. 10 and 11, the first and second parallel paths 1412*c* and 1414*c* are independent of one another and provide a redundancy such that if one of the paths is affected by a soft error, the output from the affected path is not stored onto the storage unit 1420.

For the reasons described earlier, the storage unit 1420 and buffer unit 1430 are also SE robust.

Figure 13:
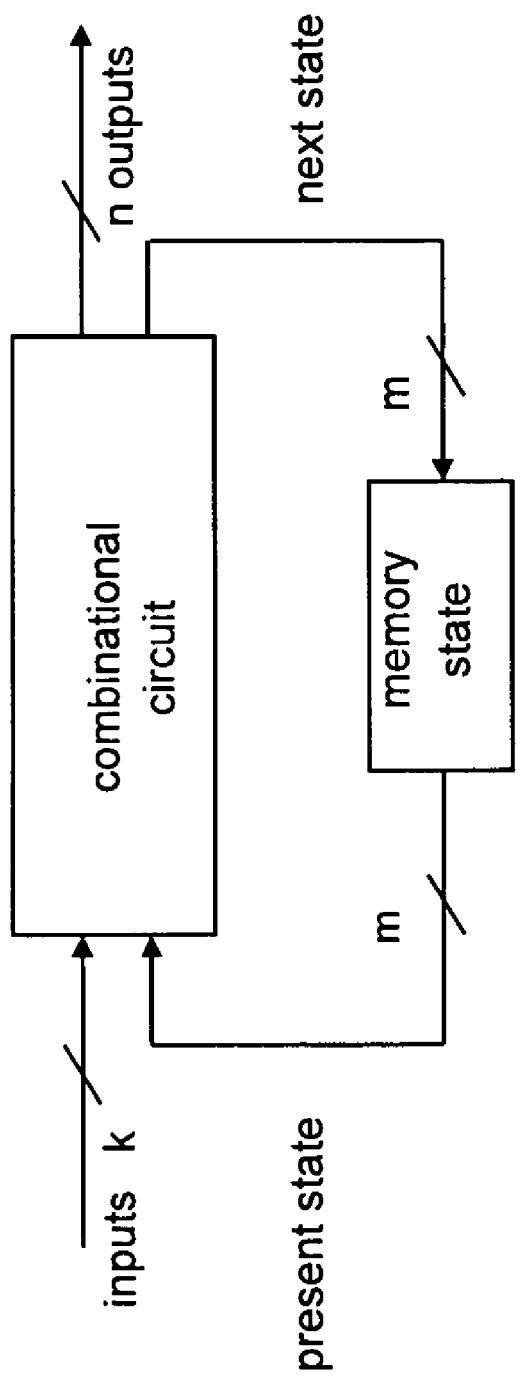
FIG. 13 is an exemplary implementation of digital logic realized with SER flip flops of any one of FIGS. 10-12.

FIG. 13 shows a generalized implementation of digital logic which comprises sequential logic gates that provide memory such as flip-flops as well as combinational logic gates. The memory state illustrated in FIG. 13 may refer to any one of the flip-flops 1000, 1100, 1200 discussed earlier. Therefore, it will be appreciated that using any one of the flip-flops 1000, 1100, 1200 one may realize an SE robust digital logic.

Accordingly, it will be appreciated by a person of ordinary skill in the art that the present invention provides improved robustness for flip-flop circuits in the face of soft errors. Further, although the invention has been described with reference to certain specific embodiments, various modifications thereof will be apparent to those skilled in the art without departing from the scope of the invention as defined by the appended claims.

What is claimed is:

1. A flip-flop comprising a transfer unit for receiving at least one data signal and at least one clock signal, a storage unit coupled to the transfer unit and a buffer unit coupled to the storage unit:

the transfer unit comprising:
    a plurality of input nodes adapted to receive said at least one data signal and said at least one clock signal;
    a first output node for providing a sampled data signal in response to said at least one clock signal and said at least one data signal; and
    a second output node for providing a sampled inverse data signal complementary to the sampled data signal, the sampled inverse data signal provided in response to said at least one clock signal and said at least one data signal;
  the storage unit comprising a first and a second storage nodes configured to receive and store the sampled data signal and the sampled inverse data signal, the storage unit comprising:
    drive transistors configured to selectively couple one of the first and second storage nodes to ground;
    load transistors configured to selectively couple the other one of the first and second storage nodes to a power supply; and
    at least one stabilizer transistor configured to provide a corresponding redundant storage node and limit feedback between the first and second storage nodes, the redundant storage node being capable of restoring the first or second storage nodes in case of a soft error;
  the buffer unit for receiving input from at least one of the storage nodes and the redundant storage node and for providing an output sampled data signal.

2. The flip-flop of claim 1 comprising first and second stabilizer transistors configured to provide corresponding first and second redundant storage nodes.

3. The flip-flop of claim 1, wherein the load transistors and the drive transistors are arranged in a cross-coupled configuration.

4. The flip-flop of claim 2 comprising third and fourth stabilizer transistors configured to improve reliability of the first and second redundant storage nodes.

5. The flip-flop of claim 4, wherein the stabilizer transistors are arranged in a cross-coupled configuration and the load transistors and the drive transistors are effectively cross coupled via the stabilizer transistors.

6. The flip-flop of claim 1, wherein the transfer unit further comprises a first and a second clock-controlled parallel paths, each path configured for receiving said at least one data signal and said at least one clock signal and having an output coupled to a corresponding one of said first and second output nodes for providing said sampled inverse data and data signals.

7. The flip-flop of claim 6, wherein the first and second paths are independent of one another.

8. The flip-flop of claim 6, wherein said at least one data signal comprises first and second complementary data signals and said at least one clock signal comprises four multiple phase clock signals,
the first path is configured to receive the first data signal and said clock signals and provide said sampled inverse data signal; and,
the second path is coupled to the first path for receiving the second complementary data signal and provide said sampled data signal.

9. The flip-flop of claim 8, wherein the transfer unit is adapted to provide said sampled signals during a time window determined by said four clock signals.

10. The flip-flop of claim 6, wherein the two paths provide the sampled data signal and the sampled inverse data signal independently of one another.

11. The flip-flop of claim 10, wherein each path comprises multiple stages having single phase clock-controlled inverters, the first path configured to receive said data signal and generate the sampled inverse data signal to one of the nodes of the storage unit; the second path configured to receive said data signal and generate said sampled data signal to another node of the storage unit.

12. The flip-flop of claim 10, wherein each path comprises at least one inverter stage configured to receive multiple phases of said clock signal, the first path configured to provide the sampled inverse data signal to one of the nodes of the storage unit; the second path configured to provide the sampled data signal to another node of the storage unit.

13. The flip-flop of claim 1 wherein the buffer unit comprises an inverter coupled to the storage unit and configured to provide an output data signal having a same polarity as the input data signal.

14. A digital logic circuit comprising the flip-flop of claim 1.

* * * * *